(12) United States Patent
Ding et al.

(10) Patent No.: US 12,317,452 B2
(45) Date of Patent: May 27, 2025

(54) HEAT DISSIPATING STRUCTURE

(71) Applicant: Lenovo (Beijing) Limited, Beijing (CN)

(72) Inventors: Xintong Ding, Beijing (CN); Huanhuan Xue, Beijing (CN); Ting Tian, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 177 days.

(21) Appl. No.: 18/161,182

(22) Filed: Jan. 30, 2023

(65) Prior Publication Data

US 2023/0247797 A1 Aug. 3, 2023

(30) Foreign Application Priority Data

Jan. 29, 2022 (CN) .......................... 202210111357.1

(51) Int. Cl.
*H05K 7/20* (2006.01)

(52) U.S. Cl.
CPC ..... *H05K 7/20381* (2013.01); *H05K 7/20254* (2013.01); *H05K 7/20327* (2013.01); *H05K 7/20336* (2013.01)

(58) Field of Classification Search
CPC .. H05K 7/20; H05K 7/20218; H05K 7/20254; H05K 7/20327; H05K 7/20336;
(Continued)

(56) References Cited

U.S. PATENT DOCUMENTS

| 6,460,612 B1 * | 10/2002 | Sehmbey .............. F28D 15/046 |
| | | 174/15.2 |
| 2001/0037880 A1 * | 11/2001 | Solondz ................ H01L 23/427 |
| | | 165/274 |

(Continued)

FOREIGN PATENT DOCUMENTS

| CN | 102566605 A | 7/2012 |
| CN | 106091462 A | 11/2016 |

(Continued)

OTHER PUBLICATIONS

CN-110430715-A English Translation (Year: 2019).*

*Primary Examiner* — Amir A Jalali
(74) *Attorney, Agent, or Firm* — ANOVA LAW GROUP, PLLC

(57) ABSTRACT

A heat dissipating structure includes a cold plate configured to exchange heat with a heat dissipating device; a liquid pipe disposed at both ends of the cold plate, the liquid pipe being configured to transport heat conducting liquid; and a deformation structure configured in the liquid pipe and located at a position corresponding to the cold plate, wherein the deformation structure deforms as an ambient temperature changes. The deformation structure is configured in the heat dissipating structure to manage the flow rate of the heat conducting liquid. The deformation structure deforms at different ambient temperatures. Based on a relationship between the temperature and a deformation coefficient, the flow rate of the heat conducting liquid flowing through the liquid pipe can be controlled for different temperatures. Thus, a desired heat dissipating capacity can be provided to the heat dissipating device to satisfy the needs of users.

10 Claims, 3 Drawing Sheets

(58) Field of Classification Search
CPC ............. H05K 7/20381; H05K 7/2039; H05K 7/20509; H05K 2201/0308; H01L 23/367; H01L 23/473; G06F 1/20; F25B 41/30; F25B 41/335; F25B 41/36; F25B 41/375; F25B 2341/06; F25D 17/02; F28D 15/00; F28F 27/00; F28F 1/40; F28F 13/08
See application file for complete search history.

(56) References Cited

U.S. PATENT DOCUMENTS

| | | | |
|---|---|---|---|
| 2010/0221627 A1* | 9/2010 | Nakakubo | F28D 15/043 165/104.21 |
| 2010/0300652 A1* | 12/2010 | Lee | H05K 7/20809 165/80.4 |
| 2021/0055060 A1* | 2/2021 | Meyer, IV | F28D 15/06 |
| 2023/0209778 A1* | 6/2023 | Ding | H05K 7/2039 361/704 |
| 2024/0237295 A1* | 7/2024 | Liu | H05K 7/20609 |

FOREIGN PATENT DOCUMENTS

| | | | |
|---|---|---|---|
| CN | 106973550 A | | 7/2017 |
| CN | 110430715 A | * | 11/2019 |
| CN | 111998707 A | | 11/2020 |
| CN | 215113352 U | | 12/2021 |
| JP | S5980583 A | | 5/1984 |
| JP | 2004295718 A | | 10/2004 |

* cited by examiner

HEAT DISSIPATING STRUCTURE

CROSS-REFERENCE TO RELATED APPLICATION

This application claims priority to Chinese Patent Application No. 202210111357.1, filed on Jan. 29, 2022, the entire content of which is incorporated herein by reference.

TECHNICAL FIELD

The present disclosure relates to the technical field of heat dissipation technologies and, more particularly, to a heat dissipating structure.

BACKGROUND

As the power consumption of today's chips continues to increase, regular heat sinks are no longer sufficient to satisfy the cooling needs for high power density heat dissipating devices. A two-phase liquid cooling solution is provided to solve the above problem.

When the two-phase liquid cooling is used to cool a plurality of heat dissipating devices, the amount of heat dissipated from the plurality of heat dissipating devices may be distributed inconsistently. When one device dissipates substantially more heat than the remaining devices, the liquid may evaporate substantially fast, which substantially lowers dryness (or humidity) and increases flow resistance at the corresponding inlet. As such, on one hand, less amount of liquid can be flowed through the corresponding inlet, and the amount of heat dissipated from the device may not be carried away timely by the liquid, thereby resulting in the lack of cooling liquid circulation. On the other hand, the cooling liquid can flow smoothly through the inlets corresponding to other devices dissipating less heat, the flow resistance thereof decreases, and more cooling liquid can circulate through the inlets. This creates a mismatch between the amount of the cooling liquid circulated through a heat dissipating device and the amount of the heat dissipated from the corresponding heat dissipating device.

SUMMARY

The present disclosure provides the following technical solutions.

One aspect of the present disclosure provides a heat dissipating structure. The heat dissipating structure includes: a cold plate configured to exchange heat with a heat dissipating device; a liquid pipe disposed at both ends of the cold plate, the liquid pipe being configured to transport heat conducting liquid; and a deformation structure configured in the liquid pipe and located at a position corresponding to the cold plate, where the deformation structure deforms as an ambient temperature changes.

In some embodiments, a cross-sectional area of the deformation structure in an axial direction of the liquid pipe is inversely proportional to the ambient temperature; the deformation structure has a first cross-sectional area at a first temperature, and has a second cross-sectional area at a second temperature; the first temperature is higher than the second temperature; the first cross-sectional area is smaller than the second cross-sectional area; and the cross-sectional area is directly proportional to a flow resistance of the heat conducting liquid in the liquid pipe.

In some embodiments, the cross-section of the deformation structure in the axial direction of the liquid pipe is a net-shaped structure or a uniformly distributed hole structure.

In some embodiments, the deformation structure is made of a heat-shrinkable material or a memory alloy.

In some embodiments, the liquid pipe includes a main liquid pipe and at least two branch liquid pipes, both connected with the main liquid pipe.

In some embodiments, a number of the could plates is equal to a number of the branch liquid pipes; each branch liquid pipe is configured with one cold plate; and the deformation structure is disposed in each of the at least two branch liquid pipes.

In some embodiments, the main liquid pipe and the at least two branch liquid pipes form a circulation liquid pipe structure.

In some embodiments, the liquid flows through each branch liquid pipe, absorbs heat dissipated from the corresponding heat dissipating device, and evaporates into a gas-liquid two-phase state downstream of the cold plate.

In some embodiments, the main liquid pipe is configured with a cooling capacity distribution unit configured to cause the gas-liquid two-phase heat conducting liquid to condense into a liquid state.

In some embodiments, pipe diameters of different branch liquid pipes are identical or different.

In the embodiments of the present disclosure, a heat dissipating structure is provided. The heat dissipating structure includes: a cold plate configured to exchange heat with a heat dissipating device; a liquid pipe disposed at both ends of the cold plate, the liquid pipe being configured to transport heat conducting liquid; and a deformation structure configured in the liquid pipe and located at a position corresponding to the cold plate, where the deformation structure deforms as an ambient temperature changes. The deformation structure is configured in the heat dissipating structure to manage the flow rate of the heat conducting liquid. The deformation structure deforms at different ambient temperatures. Based on a relationship between the temperature and a deformation coefficient, the flow rate of the heat conducting liquid flowing through the liquid pipe can be controlled for different temperatures. Thus, a desired heat dissipating capacity can be provided to the heat dissipating device to satisfy the needs of users.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

In order to make the objectives, technical solutions, and advantages of the present disclosure clearer, the present disclosure will be further described in detail below with reference to the accompanying drawings. Obviously, the described embodiments are only some of the embodiments of the present disclosure, not all of the embodiments. Based on the embodiments of the present disclosure, all other embodiments obtained by those of ordinary skill in the art without creative efforts shall fall within the scope of the present disclosure.

In the description of the embodiments of the present disclosure, it should be noted that, unless otherwise stated and limited, the term "connection" should be understood in a broad sense, for example, it may be an electrical connection, an internal communication between two components, or a direct connection, and may also be indirectly connected through an intermediate medium. Those of ordinary skill in the art could understand the specific meanings of the above term according to specific situations.

It should be noted that the terms such as "first\second\third" involved in the embodiments of the present disclosure are only used to distinguish similar objects, and do not represent a specific ordering of the objects. It is understood that the terms such as "first\second\third" may be interchanged in a specific order or sequence where permitted. It should be understood that the objects distinguished by the terms such as "first\second\third" distinctions may be interchanged under appropriate circumstances so that the embodiments of the present disclosure described herein may be practiced in sequences other than those illustrated or described herein.

Figure 1:
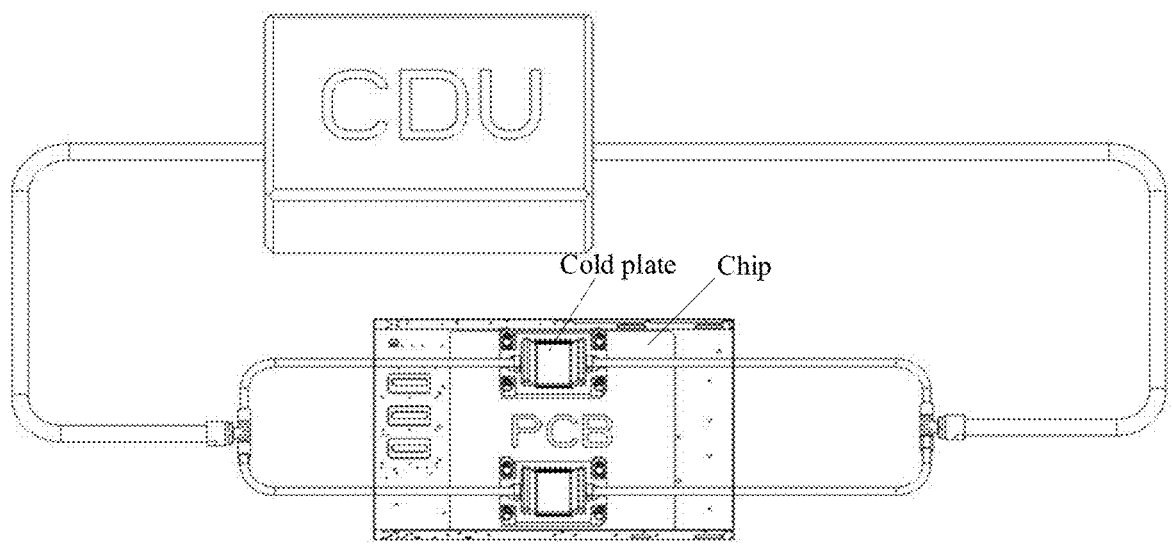
FIG. 1 is a schematic diagram showing an application scenario of an exemplary two-phase liquid cooling technology according to some embodiments of the present disclosure.

To better illustrate the present disclosure, a relevant application scenario is described herein. The cooling structure consistent with the present disclosure can be applied to a two-phase liquid cooling system. FIG. 1 is a schematic diagram showing an application scenario of an exemplary two-phase liquid cooling technology according to some embodiments of the present disclosure. As shown in FIG. 1, the two-phase liquid cooling application is implemented based on circulation pipes.

Circulation of liquid in the circulation pipes is achieved through a circulation pump. The liquid flows into cold plates (e.g., heat sinks), absorbs heat transferred from chips through the cold plates, and evaporates into a gas-liquid two-phase state. The two-phase gas-liquid flows through a chill water distribution unit (CDU), exchanges heat, and flows again into the circulation pump. Thus, the heat dissipating devices (e.g., chips) can dissipate the heat through the above-described circulation.

Figure 2:
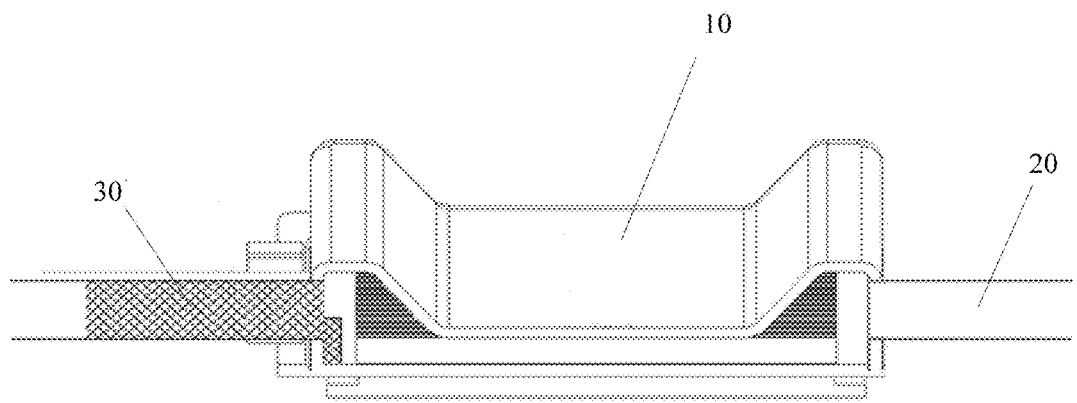
FIG. 2 is a schematic structural diagram of an exemplary heat dissipating structure according to some embodiments of the present disclosure.

FIG. 2 is a schematic structural diagram of an exemplary heat dissipating structure according to some embodiments of the present disclosure. As shown in FIG. 1, the heat dissipating structure includes a cold plate 10, a liquid pipe 20, and a deformation structure 30. The cold plate 10 is configured to exchange (i.e., absorb) heat from a heat dissipating device (not shown). The liquid pipe is disposed at both ends of the cold plate 10 and is configured to transport a heat conducting liquid. The deformation structure 30 is disposed inside the liquid pipe 20 at a position where the clod plate 10 is located. The deformation structure 30 deforms as a temperature thereof changes. Although the deformation structure 30 is shown in a net shape in FIG. 2, it is merely exemplary, and shall not be construed to limit the form of the deformation structure.

In practical applications, a heat source dissipating the heat may be in different forms. For example, the heat source may be a heat dissipating device such as a host computer, a chip, etc. The cold plate may be disposed below or above the heat source depending on the form of the heat source and a mounting manner of the heat source. The heat generated by the heat dissipating device in an operation mode is conducted to the cold plate 10. When the heat conducting liquid flows through the clod plate 10, the heat conducting liquid absorbs the heat from the cold plate 10, the temperature of the heat conducting liquid rises, and the heat conducting liquid evaporates into the gas-liquid two-phase state in the liquid pipe 20.

Because the deformation structure 30 deforms as the temperature thereof changes, the deformation structure 30 needs to be disposed at a position close to the heat source to effectively sense the temperature. In some embodiments, the deformation structure 30 presents different shapes at different temperatures to impose different flow resistances to the heat conducting liquid that flows through the deformation structure 30, thereby limiting the heat conducting liquid at different flow rates at different temperatures.

The deformation structure 30 is disposed inside the liquid pipe 20. Because the deformation structure 30 needs to limit the flow rate of the heat conducting liquid, and the heat conducting liquid evaporates into the gas-liquid two-phase state after flowing through the could plate 10, the deformation structure 30 may be disposed at an upstream position relative to the cold plate 10. To effectively sense the temperature, the deformation structure 30 may be disposed adjacent to the cold plate 10, as shown in FIG. 2.

In the embodiments of the present disclosure, the deformation structure is configured in the heat dissipating structure to manage the flow rate of the heat conducting liquid. The deformation structure deforms at different ambient temperatures. Based on a relationship between the temperature and a deformation coefficient, the flow rate of the heat conducting liquid flowing through the liquid pipe can be controlled for different temperatures. Thus, a desired heat dissipating capacity can be provided to the heat dissipating device to satisfy the needs of users.

In some embodiments, a cross-sectional area of the deformation structure in an axial direction of the liquid pipe is inversely proportional to an ambient temperature. The deformation structure has a first cross-sectional area at a first temperature, and has a second cross-sectional area at a second temperature. The first temperature is higher than the second temperature. The first cross-sectional area is smaller than the second cross-sectional area. The cross-sectional area is directly proportional to the flow resistance of the heat conducting liquid in the liquid pipe.

Figure 3A:
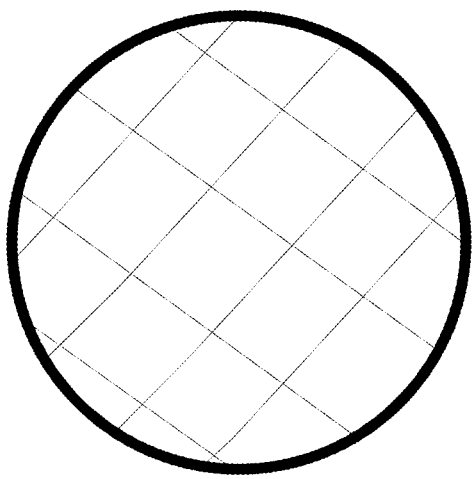
FIG. 3A is a schematic cross-sectional view of an exemplary deformation structure at a first temperature according to some embodiments of the present disclosure.
Figure 3B:
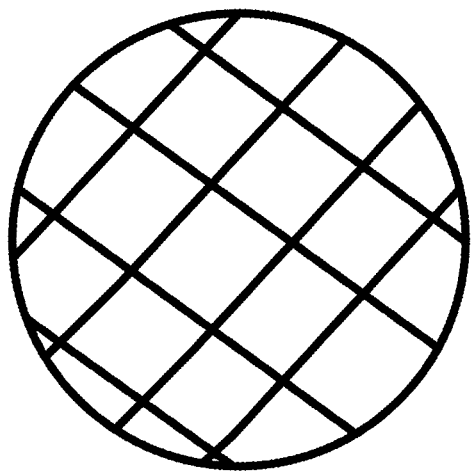
FIG. 3B is a schematic cross-sectional view of an exemplary deformation structure at a second temperature according to some embodiments of the present disclosure.

FIG. 3A is a schematic cross-sectional view of an exemplary deformation structure at a first temperature according to some embodiments of the present disclosure. FIG. 3B is a schematic cross-sectional view of an exemplary deformation structure at a second temperature according to some embodiments of the present disclosure. Referring to FIG. 3A and FIG. 3B, at the first temperature, the entire deformation structure is in a shrunk state, line segments of each net-shaped hole are thin, and a combined cross-sectional area of solid portions of the deformation structure is relatively small. In this case, each net-shaped hole of the deformation structure is relatively large, exerts less resistance to the flow of the heat conducting liquid, and allows a relatively large amount of the heat conducting liquid to pass through the deformation structure. At the second temperature, the entire deformation structure is in an expanded state, the line segments of each net-shaped hole are thick, and a combined cross-sectional area of solid portions of the deformation structure is relatively large. In this case, each net-shaped hole of the deformation structure is relatively small, exerts more resistance to the flow of the heat conducting liquid, and allows a relatively small amount of the heat conducting liquid to pass through the deformation structure.

Figure 4:
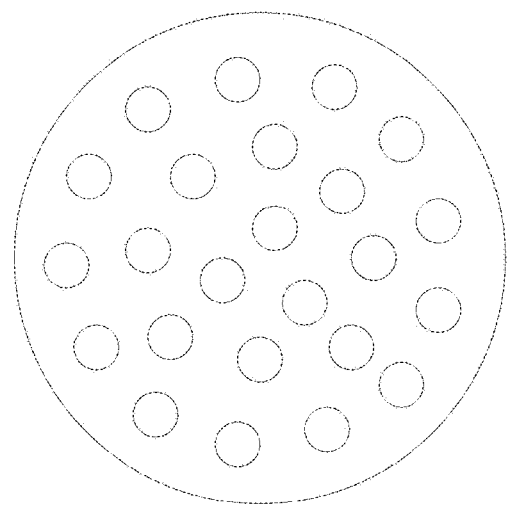
FIG. 4 is a schematic cross-sectional view of an exemplary deformation structure having hole structures according to some embodiments of the present disclosure.

Of course, in addition to the net-shaped structure, the cross-sectional area of the deformation structure may include other structures. FIG. 4 is a schematic cross-sectional view of an exemplary deformation structure having hole structures according to some embodiments of the present disclosure. As shown in FIG. 4, at a relatively high temperature, holes for the liquid to pass through may expand and become relatively large. Under a constant liquid pressure, the amount of the liquid that can flow through is relatively large. At a relatively low temperature, the holes for the liquid to pass through may shrink and become relatively small. Under a constant liquid pressure, the amount of the liquid that can flow through is relatively small.

In addition to the polygon-shaped and the round-shaped holes described above, the holes for the liquid to flow through may also have other shapes, which is not limited by the present disclosure.

The deformation structure may be made of a heat-shrinkable material or a memory alloy as long as such material deforms as the temperature thereof changes and the cross-sectional area of the deformation structure is positively proportional to the flow resistance of the heat conducting liquid in the liquid pipe.

Figure 5:
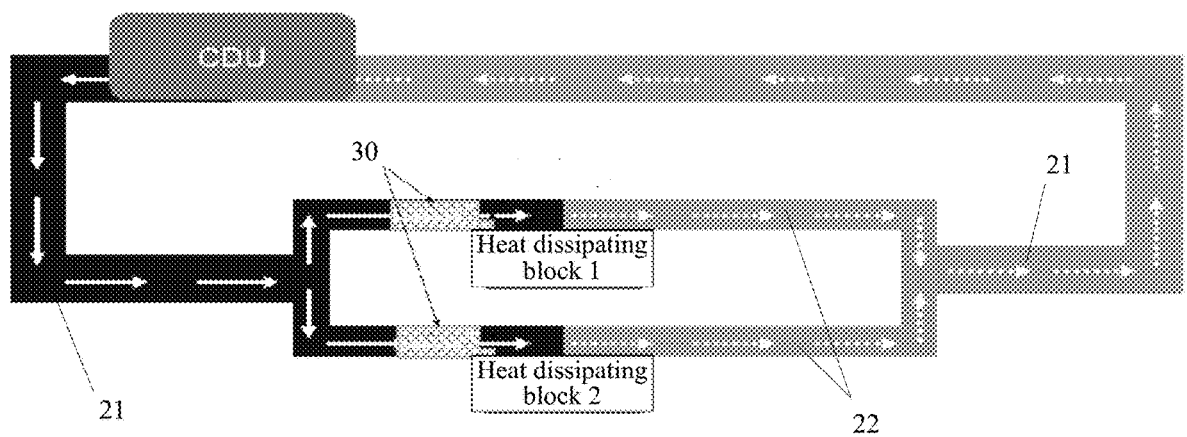
FIG. 5 is a schematic structural diagram of another exemplary heat dissipating heat dissipating structure according to some embodiments of the present disclosure.

FIG. 5 is a schematic structural diagram of another exemplary heat dissipating structure according to some embodiments of the present disclosure. As shown in FIG. 5, the liquid pipe may include a main liquid pipe 21 and at least two branch pipes 22. FIG. 5 shows liquid pipe connection configuration and a position of the deformation structure, but does not show the cold plate. As previously described, the cold plate may be disposed above a heat dissipating block 1 and a heat dissipating block 2.

Because each branch pipe is used to dissipate different heat dissipating devices, a number of the cold plates and a number of the branch pipes are the same. Each branch pipe is configured with one cold plate, and the deformation structure is disposed in the branch pipe.

Pipe diameters of different branch pipes may be identical or different. Generally, different heat dissipating devices dissipate different amount of heat and need different cooling capacities. Thus, the heat source dissipating a relatively large amount of heat may be configured with a branch pipe with a relatively large pipe diameter, while the heat source dissipating a relatively small amount of heat may be configured with a branch pipe with a relatively small pipe diameter.

In some embodiments, one main pipe and two branch pipes form a circulation pipe structure. When the heat conducting liquid flows to the could plates, the heat conducting liquid absorbs heat to cause the temperature thereof to rise, and some of the heat conducting liquid may even evaporate. Thus, gas-liquid two-phase heat conducting matter may appear in the liquid pipe downstream of the cold plate. As shown in FIG. 5, the main liquid pipe is further configured with a cooling capacity distribution unit, which is configured to cause the gas-liquid two-phase heat conducting liquid to condense into a liquid state. The heat conducting liquid in the liquid state circulates and flows to the cold plates, and continues to exchange heat to turn into a gas-liquid two-phase state.

In the embodiments of the present disclosure, the deformation structure is configured in the liquid pipe. The amount liquid flowing through the deformation structure dynamically changes as the temperature of the heat dissipating device changes. Thus, the device dissipating more heat receives more heat conducting liquid, while the device dissipating less heat receives less heat conducting liquid. The distribution of the heat conducting liquid matches the distribution of the heat dissipated by the heat dissipating devices. As such, the dryness of the heat conducting liquid at the downstream of the could plates can be stabilized, and overheating or overcooling of some heat dissipating device can be effectively prevented.

Therefore, when the heat dissipating structure cools a plurality of heat dissipating devices, the flow rates of the heat conducting liquid in various liquid pipes are dynamically balanced (or adjusted). The flow resistance of the liquid pipe corresponding to the device dissipating less heat is increased, and the flow resistance of the liquid pipe corresponding to the device dissipating more heat is reduced, thereby receiving more heat conducting liquid. Thus, the dryness of the heat conducting liquid in the plurality of liquid pipes of the cooling system can be stabilized, and the cooling efficiency can be improved, thereby facilitating a smooth operation of the system.

In some embodiments, a heat-shrinkable net structure or a memory alloy structure (i.e., the deformation structure) is added inside the liquid pipe above the cold plate. The heat-shrinkable net structure is made of heat-shrinkable material, and the memory alloy structure is made of memory metal. Both the heat-shrinkable structure and the memory alloy structure sense the temperature of the heat dissipating device. When the temperature of the heat dissipating device is detected to be higher than 50° C., the heat-shrinkable net structure or the memory alloy structure contracts by 8%. Accordingly, the flow resistance inside the liquid pipe is reduced, and the amount of the heat conducting liquid flowing through the liquid pipe corresponding to the heat dissipating device is increased.

When the temperature of the heat dissipating device is detected to be lower than or equal to 50° C., the heat-shrinkable net structure or the memory alloy structure expands by 8%. Accordingly, the flow resistance inside the liquid pipe is increased, and the amount of the heat conducting liquid flowing through the liquid pipe corresponding to the heat dissipating device is reduced. Thus, the flow rates of the heat conducting liquid flowing in the liquid pipes are balanced, the overheating or the overcooling of individual heat dissipating device is effectively prevented, the dryness of the heat conducting liquid is the liquid pipes downstream of the cold plates is stabilized, and the cooling efficiency is improved.

Various embodiments in the specification are described in a progressive manner, and each embodiment focuses on the differences from other embodiments, and for the same and similar parts between the various embodiments, reference can be made to each other. At the same time, the features described in the embodiments in the specification may be replaced or combined with each other, such that those skilled in the art can realize or use the present disclosure. As for the devices disclosed in the embodiments, because of the correspondence to the method disclosed in the embodiments, the description is relatively simple, and reference can be made to the description of the method for relevant parts.

It should also be noted that in the specification, relational terms such as first and second are used only to distinguish one entity or operation from another, and do not necessarily require or imply that there is such actual relationship or order between those entities or operations. Moreover, the terms "comprising," "including" or any other variation thereof are intended to encompass non-exclusive inclusion such that a process, method, article or device comprising a list of elements includes not only those elements, but also includes not explicitly listed or other elements inherent to such a process, method, article or apparatus. Without further limitation, an element qualified by the phrase "comprising a . . . " does not preclude the presence of additional identical elements in a process, method, article or apparatus that includes the element.

Those skilled in the art can further realize that the units and algorithm steps of the examples described in the embodiments disclosed in the specification can be implemented by electronic hardware, computer software, or a combination of both. To clearly illustrate interchangeabilities of hardware and software, the structures and steps of each example have been generally described in the specification in accordance with the functions. Whether these functions are implemented by hardware or software depends on the specific application and design constraints of the technical solution. Those skilled in the art can use different methods for each specific application to implement the described functions, but such implementation should not be considered beyond the scope of this application.

The steps of the method or algorithm described in the embodiments disclosed in the specification can be directly implemented by hardware, a software module executed by a processor, or a combination thereof. The software module can be stored in random access memory (RAM), internal memory, read-only memory (ROM), electrically programmable ROM, electrically erasable programmable ROM, registers, hard disks, removable disks, CD-ROMs, or any other storage media known in the technical field.

The above description of the disclosed embodiments enables those skilled in the art to implement or use this application. Various modifications to these embodiments will be obvious to those skilled in the art, and the general principles defined herein can be implemented in other embodiments without departing from the spirit or scope of the present application. Therefore, this application will not be limited to the embodiments shown in the specification, but should conform to the broadest scope consistent with the principles and novelties disclosed in the specification.

What is claimed is:

1. A heat dissipating structure, comprising:
   a cold plate configured to exchange heat with a heat dissipating device;
   a liquid pipe disposed at both ends of the cold plate, the liquid pipe being configured to transport heat conducting liquid and including at least two branch liquid pipes; and
   a deformation structure configured in the liquid pipe and located at an upstream position in the liquid pipe relative to the cold plate, wherein the deformation structure deforms as an ambient temperature changes and is disposed in each of the at least two branch liquid pipes.

2. The heat dissipating structure according to claim 1, wherein:
   a cross-sectional area of the deformation structure in an axial direction of the liquid pipe is inversely proportional to the ambient temperature;
   the deformation structure has a first cross-sectional area at a first temperature, and has a second cross-sectional area at a second temperature;
   the first temperature is higher than the second temperature;
   the first cross-sectional area is smaller than the second cross-sectional area; and
   the cross-sectional area is directly proportional to a flow resistance of the heat conducting liquid in the liquid pipe.

3. The heat dissipating structure according to claim 2, wherein:
   the cross-section of the deformation structure in the axial direction of the liquid pipe is a net-shaped structure or a uniformly distributed hole structure.

4. The heat dissipating structure according to claim 2, wherein:
   the deformation structure is made of a heat-shrinkable material or a memory alloy.

5. The heat dissipating structure according to claim 1, wherein:
   the liquid pipe further includes a main liquid pipe and both of the at least two branch liquid pipes are connected with the main liquid pipe.

6. The heat dissipating structure according to claim 5, wherein:
   a number of the cold plates is equal to a number of the branch liquid pipes; and
   each branch liquid pipe is configured with one cold plate.

7. The heat dissipating structure according to claim 5, wherein:
   the main liquid pipe and the at least two branch liquid pipes form a circulation liquid pipe structure.

8. The heat dissipating structure according to claim 5, wherein:
   the liquid flows through each branch liquid pipe, absorbs heat dissipated from the corresponding heat dissipating device, and evaporates into a gas-liquid two-phase state downstream of the cold plate.

9. The heat dissipating structure according to claim 8, wherein:
   the main liquid pipe is configured with a cooling capacity distribution unit configured to cause the gas-liquid two-phase heat conducting liquid to condense into a liquid state.

10. The heat dissipating structure according to claim 5, wherein:
    pipe diameters of different branch liquid pipes are identical or different.

* * * * *